United States Patent
Co et al.

(10) Patent No.: US 7,111,211 B1
(45) Date of Patent: Sep. 19, 2006

(54) EFFICIENT AIR-FLOW LOOP THROUGH DUAL BURN-IN CHAMBERS WITH REMOVABLE PATTERN-GENERATOR BOARDS FOR MEMORY-MODULE ENVIRONMENTAL TESTING

(75) Inventors: Ramon S. Co, Trabuco Canyon, CA (US); Tat Leung Lai, Torrance, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

(21) Appl. No.: 11/306,753

(22) Filed: Jan. 10, 2006

Related U.S. Application Data (63) Continuation-in-part of application No. 10/906,318, filed on Feb. 14, 2005, which is a continuation-in-part of application No. 10/249,843, filed on May 12, 2003, now Pat. No. 6,901,162.

(51) Int. Cl.
*G11C 29/00* (2006.01)
*G01R 31/28* (2006.01)
*G01R 31/02* (2006.01)

(52) U.S. Cl. ............ 714/718; 324/760; 714/724
(58) Field of Classification Search ............ None
See application file for complete search history.

(56) References Cited

U.S. PATENT DOCUMENTS

| | | | |
|---|---|---|---|
| 4,374,317 A | 2/1983 | Bradshaw | 219/385 |
| 4,745,354 A | 5/1988 | Fraser | 62/259.2 |
| 5,003,156 A | 3/1991 | Kilpatrick et al. | 219/209 |
| 5,093,982 A | 3/1992 | Gussman | 29/705 |
| 5,397,998 A | 3/1995 | Soeno et al. | 324/760 |
| 6,005,404 A | 12/1999 | Cochran et al. | 324/760 |
| 6,157,201 A | 12/2000 | Leung, Jr. | 324/760 |
| 6,321,353 B1* | 11/2001 | Debenham | 714/724 |
| 6,392,427 B1* | 5/2002 | Yang | 324/755 |
| 6,910,162 B1 | 6/2005 | Co et al. | 714/718 |
| 2002/0070745 A1 | 6/2002 | Johnson et al. | 324/765 |
| 2005/0146343 A1 | 7/2005 | Wright et al. | 324/760 |
| 2005/0179457 A1 | 8/2005 | Min et al. | 324/760 |

* cited by examiner

*Primary Examiner*—Christine T. Tu
(74) *Attorney, Agent, or Firm*—Stuart T. Auvinen (57) ABSTRACT

Two heat chambers are placed side-by-side. Heated air is blown upward through a first chamber and downward through a second heat chamber. An upper heating unit has a blower and heater that heat air exiting the first chamber and blows the heated air into the top of the second chamber. A lower heating unit has a blower and heater that heat air exiting the second chamber and blows the heated air into the top of the first chamber. Air is circulated in a loop through the two heat chambers by the two heating units. Inefficiencies from return pipes are eliminated by using the second chamber. The heated air is blown past memory modules under test in a heat chamber that has an insulated backplane. Pattern-generator cards outside the heat chamber exercise the memory modules and are cooled while memory modules in the heat chamber are heated.

20 Claims, 10 Drawing Sheets

CROSS SECTION THROUGH MIDDLE

FIG. 9B

CROSS SECTION THROUGH TOP

EFFICIENT AIR-FLOW LOOP THROUGH DUAL BURN-IN CHAMBERS WITH REMOVABLE PATTERN-GENERATOR BOARDS FOR MEMORY-MODULE ENVIRONMENTAL TESTING

RELATED APPLICATIONS

This application is a continuation-in-part (CIP) of the co-pending application for "Manifold-Distributed Air Flow Over Removable Test Boards in a Memory-Module Burn-In System With Heat Chamber Isolated by Backplane", U.S. Ser. No. 10/906,318, filed Feb. 14, 2005, which is a CIP of "Memory-Module Burn-In System with Removable Pattern-Generator Boards Separated from Heat Chamber by Backplane", U.S. Ser. No. 10/249,843, filed May 12, 2003, now U.S. Pat. No. 6,901,162 issued Jun. 21, 2005.

FIELD OF THE INVENTION

This invention relates to environmental test systems of memory modules, and more particularly to a looping air flow within the test system.

BACKGROUND OF THE INVENTION

Electrical components having an enhanced reliability are needed for high-availability and/or critical systems such as web or transaction servers. Additional testing may be performed on components such as board assemblies, semiconductor chips, and memory modules. Often this additional testing is performed at an elevated temperature. Such environmental testing is also known as burn-in.

Weak components often fail earlier at elevated temperatures than at normal temperatures. Poor solder connections on boards or modules can break at higher temperatures, and thermal expansion can loosen poorly seated components. Other manufacturing defects that do not cause immediate failures can create failures that appear after many hours of normal operation at normal temperatures, or after just a few hours at elevated temperatures. Thus elevated-temperature testing can screen for weak components that might later fail in the field, enhancing reliability.

Electronic systems such as servers and personal computers (PCs) use dynamic-random-access memory (DRAM) chips mounted on small, removable memory modules. Older single-inline memory modules (SIMMs) have been replaced with dual-inline memory modules (DIMMs), 184-pin RIMMs (Rambus inline memory modules) and 184-pin DDR (double data rate) DIMMs. New kinds of memory modules continue to be introduced, such as 240-pin DDR2 (double data rate 2) DIMMs.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Burn-in testing can be quite expensive, as each module may have to remain at an elevated temperature in a specialized burn-in tester for many hours or even days. Ideally, the memory module is exercised electronically during the burn-in testing, rather than simply be stored at the high temperature and later tested. Operating the memory module at higher frequencies increases internal heating within the DRAM chips, providing more realistic and thorough testing, increasing reliability.

Exercising the memory modules at higher frequencies is difficult, especially when the modules are within a burn-in oven or heated test chamber. Cables or wires that connect an external test-pattern generator or other test equipment to the memory modules within the oven can be long, severely limiting the frequency of operation.

The parent applications disclosed a memory-module burn-in test system that has removable pattern-generator boards. The pattern-generator boards are separated by an insulated backplane from a heat chamber that contains the memory modules under test.

What is desired is improved hot-air flow in such a burn-in test system that tests memory modules at elevated temperatures. An air-flow and heating system is desired for the test system with the removable pattern-generator boards that are insulated from the heat chamber.

BRIEF DESCRIPTION OF THE DRAWINGS

FIGS. 3A–B show back and front sides of the burn-in backplane with pattern-generator cards and module motherboards plugged in.

DETAILED DESCRIPTION

The present invention relates to an improvement in memory module environmental testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The parent applications disclosed a memory-module burn-in test system with removable pattern-generator boards. The pattern-generator boards are separated by an insulated backplane from a heat chamber that contains the memory modules under test. FIGS. 1–6 relate to the parent applications while FIGS. 7–9 relate to the improvement of the present invention.

Heat Chamber Separated from Pattern-Generator Cards FIGS. 1–4

Figure 1:
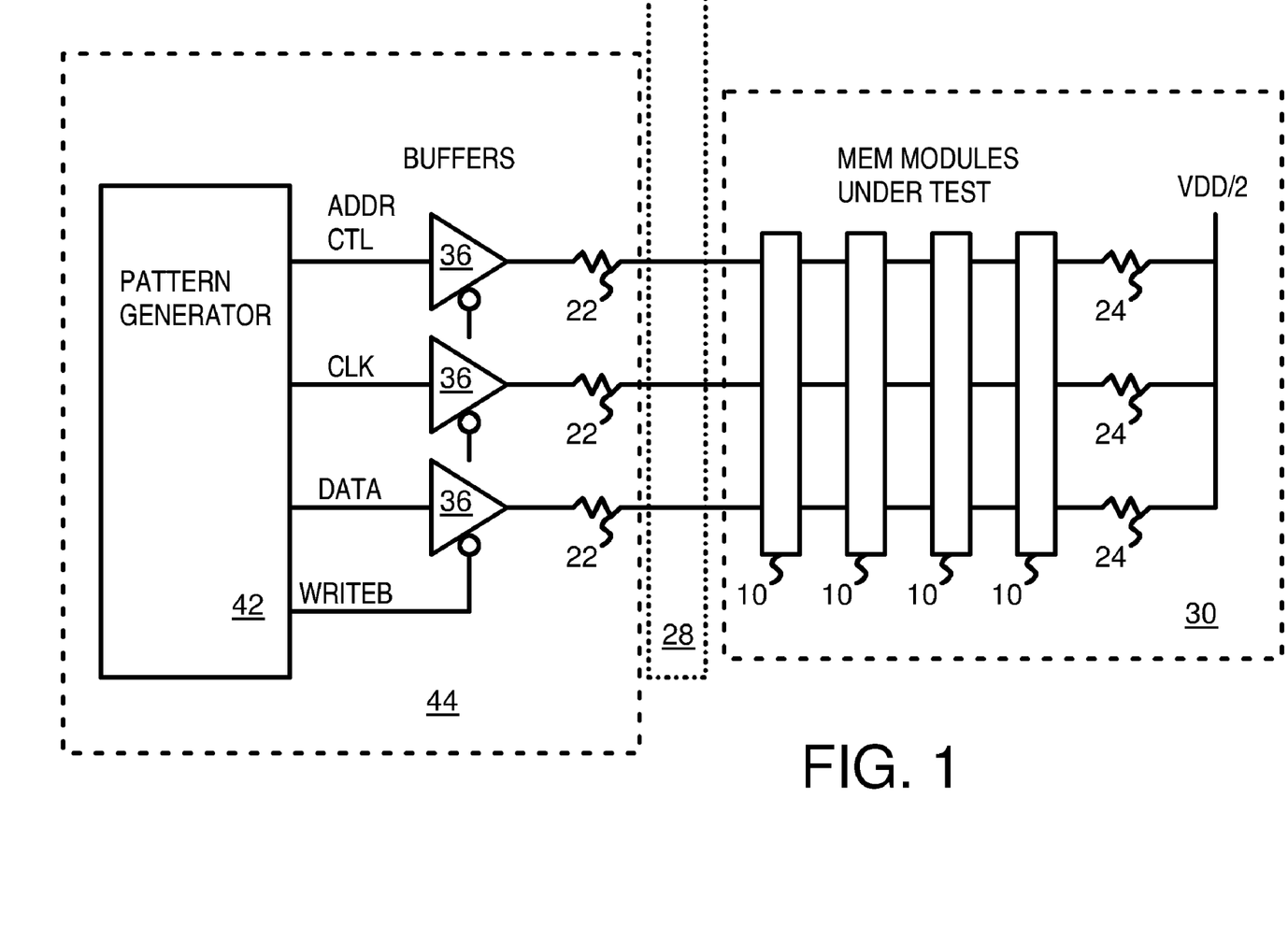
FIG. 1 is an electrical block diagram of a burn-in tester of memory modules.

FIG. 1 is an electrical block diagram of a burn-in tester of memory modules. Backplane 28 separates pattern-generator card 44 from module motherboard 30. A socket (not shown) on the back side of backplane 28 receives an edge of pattern-generator card 44 while a socket (not shown) on the front side of backplane 28 receives an edge of module motherboard 30. Wiring traces and vias on backplane 28 connect signals on the front-side and back-side sockets.

Pattern-generator card 44 contains pattern generator 42, which can be a logic chip containing a pattern-generator circuit. A programmable logic chip such as a field-programmable gate array (FPGA) may be used for pattern generator 42. Pattern generator 42 generates the control, address, and data signals necessary to exercise memory modules 10 inserted into sockets on module motherboard 30. Memory cells on memory modules 10 are addressed in a sequence and written by pattern generator 42. Pattern generator 42 can read back the data from the memory cells. The read data can be compared to expected data by pattern generator 42, or the read data can simply be ignored. Failures can be detected later by external testing once the memory modules are removed from the burn-in tester.

Buffers 36 provide the necessary drive current to drive the large input capacitances of memory modules 10. A write signal from pattern generator 42 can disable some of buffers 36 (such as data buffers) during read operations or can be used to reverse direction.

A clock signal for synchronous DRAMs can also be driven from pattern generator 42 or from a zero-delay buffer 36 such as from a phase-locked loop (PLL). Other specialized clock-driver circuits can be substituted. Buffers 36 may include registers on some signals; the registers can be clocked by the clock signal or by some other signal. Buffers 36 could be located on pattern-generator card 44 or on module motherboard 30.

Termination is provided by resistors 22, 24. These resistors 22, 24 are useful for reduced-voltage-swing DRAMs such as on double-data-rate (DDR) memory modules. The values of resistors 22, 24 can be chosen to reduce the voltage swing to half the normal supply-voltage (Vcc) swing. Expansion is possible by cascading buffers, modules, and terminations.

Figure 2:
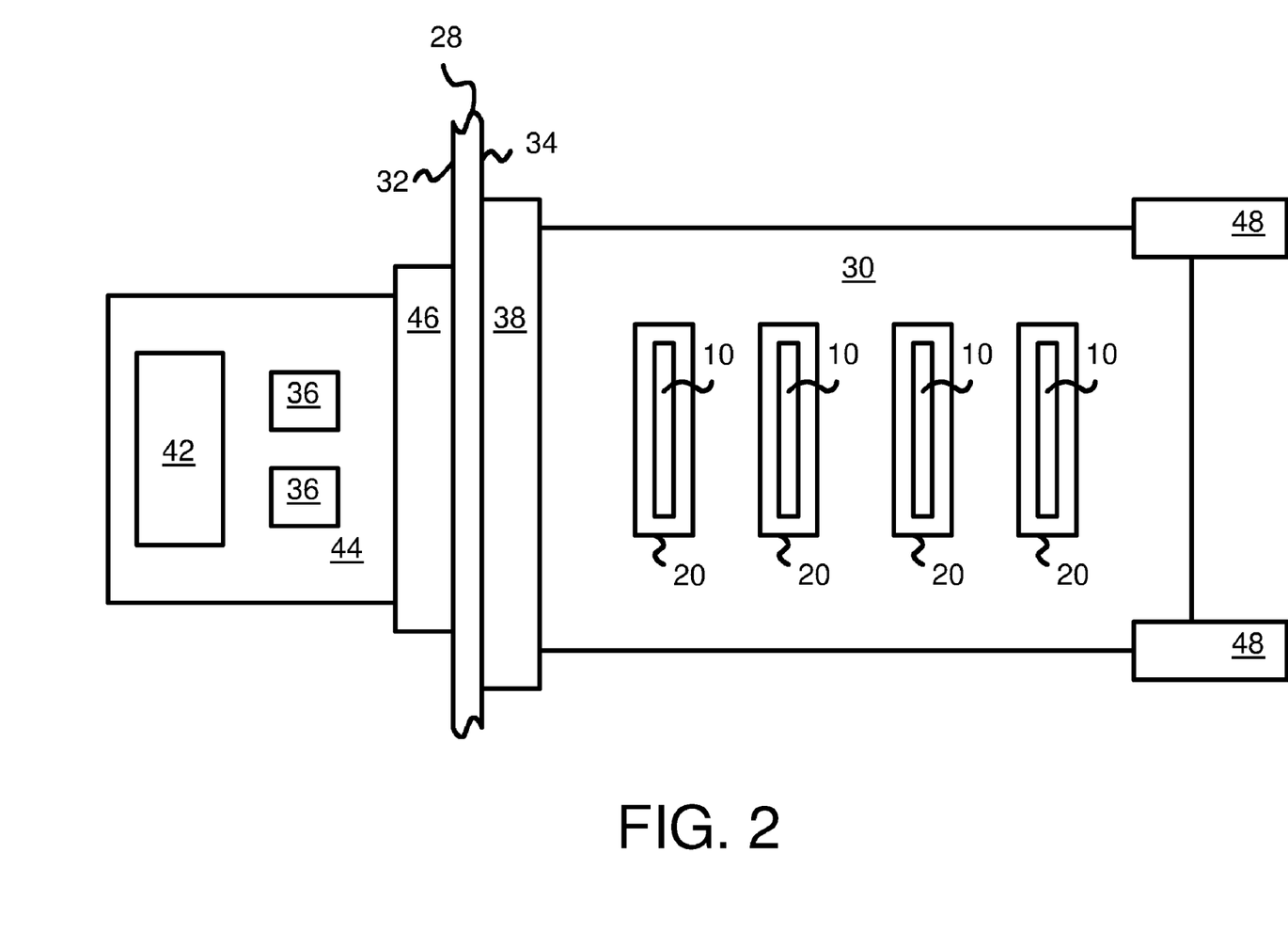
FIG. 2 is a side view of a pattern-generator card and a module motherboard plugged into a portion of the backplane.

FIG. 2 is a side view of a pattern-generator card and a module motherboard plugged into a portion of the backplane. Card socket 46 receives an edge of pattern-generator card 44 that has contact pads to make electrical contact in the socket. Signals such as address, data, and DRAM control are generated by pattern generator 42 and buffered by buffers 36 on pattern-generator card 44.

Card socket 46 is mounted to back-side 32 of backplane 28, while motherboard socket 38 is mounted to front-side 34 of backplane 28. Metalized vias and traces on backplane 28 connect signals in card socket 46 to corresponding signals in motherboard socket 38.

An edge of module motherboard 30 contains contact pads that are inserted into motherboard socket 38. Signals from these contact pads are routed to memory-module sockets 20 by traces on module motherboard 30. Memory modules 10 are inserted into memory-module sockets 20 for burn-in testing. Signals can be routed in parallel to all memory-module sockets 20, while some signals may be applied to just one of memory-module sockets 20, or unique address or socket-select signals can differ among memory-module sockets 20 to allow one of memory modules 10 to be addressed separately from the others. When data is not read back for comparison by pattern generator 42, then identical, parallel signal connections can be used for all memory-module sockets 20.

A technician or operator can remove module motherboard 30 using ejectors 48 to grip module motherboard 30. Once removed, memory modules 10 can be removed for further testing by another (post burn-in) tester and new memory modules 10 inserted into memory-module sockets 20. Module motherboard 30 can then be re-inserted to burn-in test the new modules.

Pattern-generator card 44 can also be removed from card socket 46 by a technician. This allows for defective pattern-generator cards 44 to be removed for repair while another pattern-generator card 44 is inserted. Different types of pattern-generator card 44 can be inserted into card socket 46 for testing different types of memory modules, or for specialized testing.

Figure 3A:
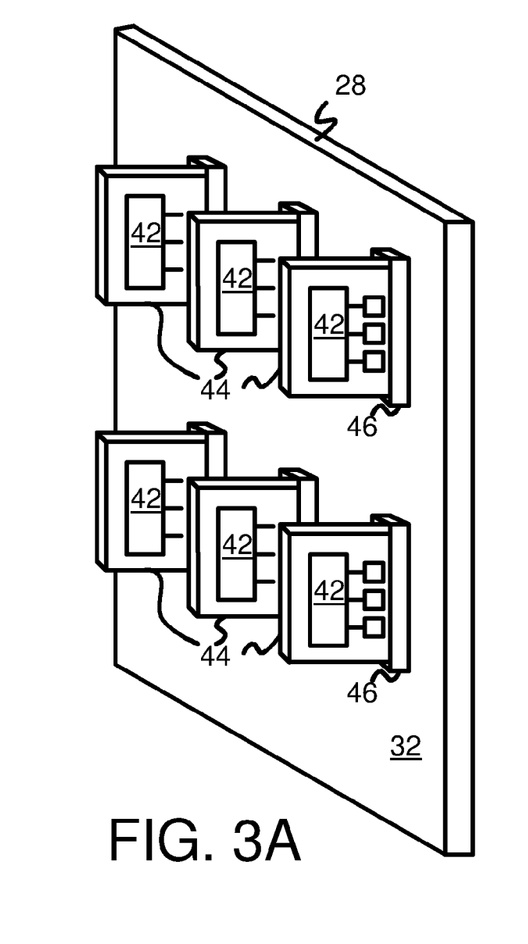
Figure 3B:
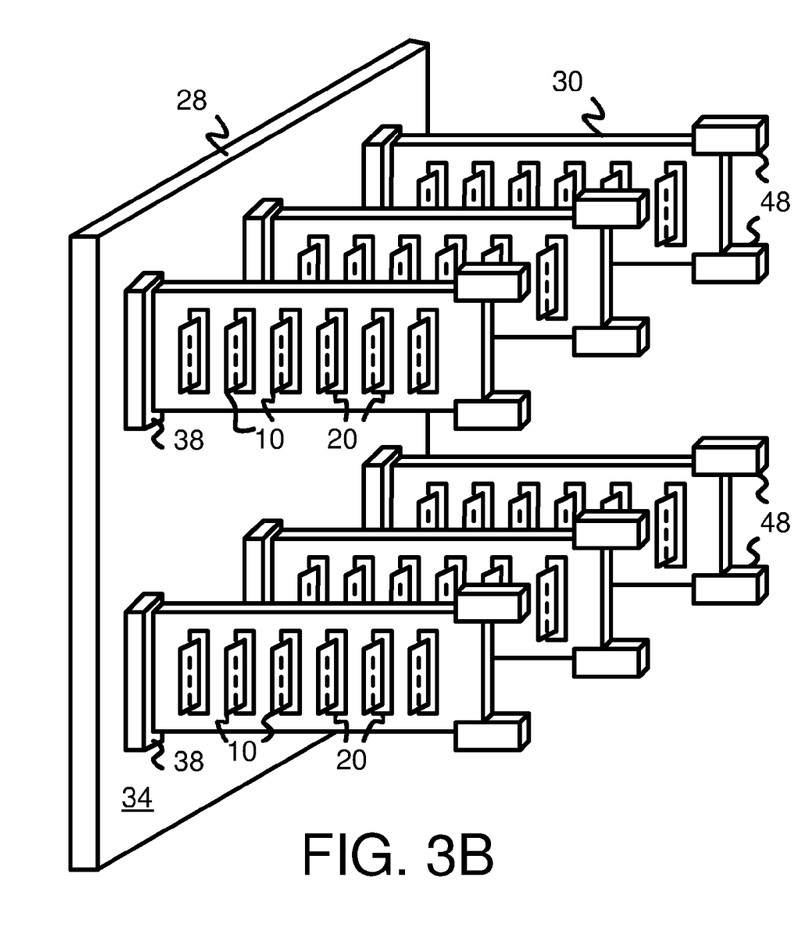

FIGS. 3A–B show back and front sides of the burn-in backplane with pattern-generator cards and module motherboards plugged in. In FIG. 3A, back-side 32 of backplane 28 has many card sockets 46 in rows and columns. Each card socket 46 can receive a pattern-generator card 44 that contains a pattern generator 42 that generates control signals for one module motherboard 30 plugged into the other side of backplane 28 (FIG. 3B). Wiring traces formed in and on backplane 28 connect electrical signals from one card socket 46 on back-side 32 to one motherboard socket 38 on front-side 34.

In FIG. 3B, front-side 34 of backplane 28 is shown. Rows and columns of motherboard socket 38 are arrayed on front-side 34. Each motherboard socket 38 can receive a module motherboard 30. Memory modules 10 inserted into memory-module sockets 20 are tested by an opposing pattern-generator card 44 on the opposite side of backplane 28. Ejectors 48 are useful for removing and inserting module motherboard 30 into motherboard socket 38 before and after burn-in testing.

Figure 4:
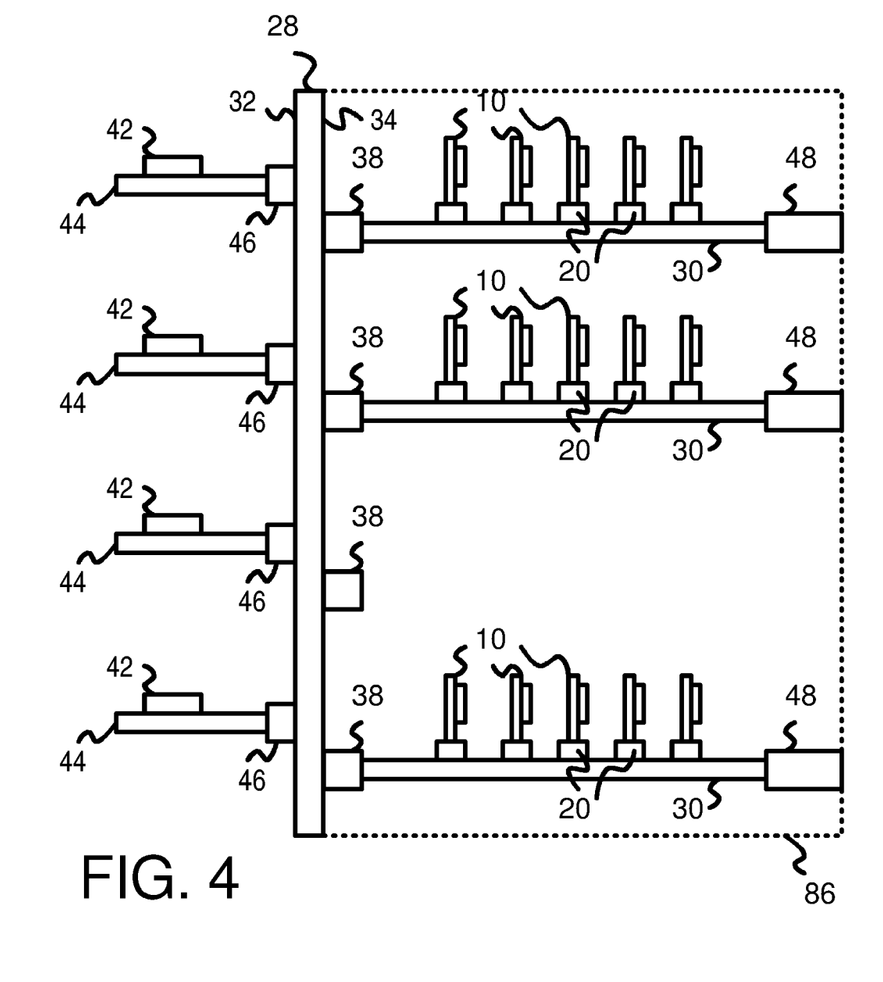
FIG. 4 is an overhead view of a burn-in tester for memory modules.

FIG. 4 is an overhead view of a burn-in tester for memory modules. Memory modules 10 inserted into memory-module sockets 20 on module motherboards 30 are kept at an elevated temperature by blowing hot air into a heat chamber surrounding module motherboards 30. This heat chamber is enclosed by backplane 28 and by the sides of heat chamber 86 and top and bottom dividers (not shown).

Pattern-generator cards 44 are inserted into card sockets 46 on back-side 32 of backplane 28, and can be kept at a cooler temperature than module motherboards 30, since pattern-generator cards 44 are outside of heat chamber 86 formed by backplane 28 and the sides of heat chamber 86. Backplane 28 provides some insulation between the heat chamber and pattern-generator cards 44, allowing pattern generator 42 to be at a lower temperature than memory modules 10.

The front or sides of the heat chamber 86 can be temporarily opened to allow removal of module motherboards 30 from motherboard sockets 38. For example, a hinged cabinet door may be provided on one of the sides of heat chamber 86. Windows may also be provided. Ejectors 48 face the front of the heat chamber, allowing a technician to pull module motherboard 30 out of motherboard socket 38 through the open front of the heat chamber.

Figure 5:
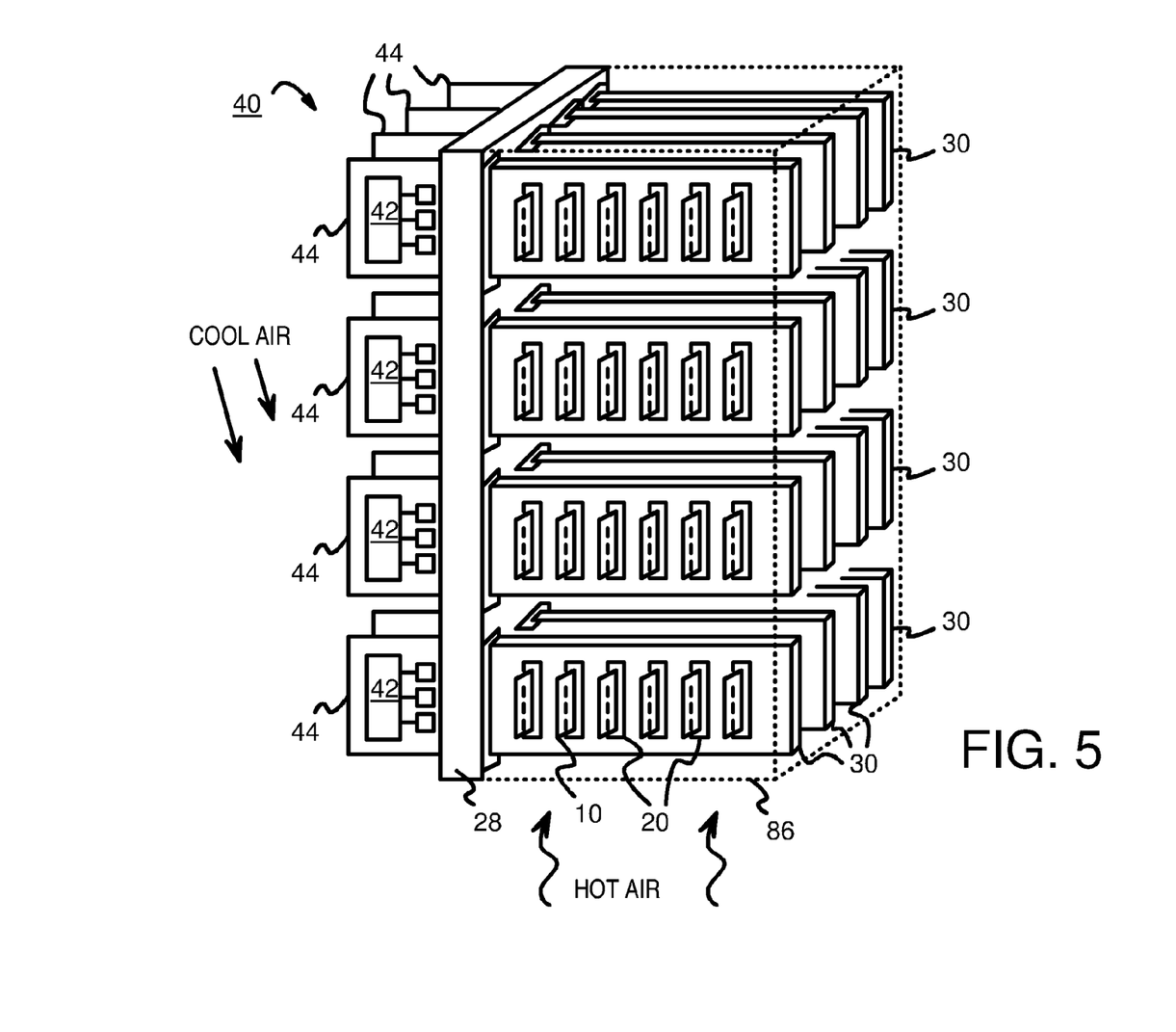
FIG. 5 is a perspective view from the front left of the burn-in tester.

Hot Air Flow in Heat Chamber—FIG. 5

FIG. 5 is a perspective view from the front left of the burn-in tester. Hot air can be blown into the bottom or sides of the heat chamber 86, rising past module motherboards 30 to raise the temperature of memory modules 10 inserted into memory-module sockets 20.

Backplane 28 not only provides electrical connection from each pattern-generator card 44 to each module motherboard 30, but provides some thermal insulation. A layer of foam insulation may be attached to backplane 28 and to the sides of heat chamber 86. Pattern-generator cards 44 are kept cooler than module motherboards 30 because back area 40 is separated from heat chamber 86 by backplane 28.

Cool air can be blown across pattern-generator cards 44 while hot air is blown through the heat chamber across module motherboards 30. Pattern generators 42 on pattern-generator cards 44 can be kept cooler than memory modules 10, allowing for longer life and better current drive of pattern generator 42.

Backplane 28, pattern-generator cards 44, and module motherboards 30 can be mounted on a rack that is enclosed by heat chamber 86. Several racks can be mounted on top of each other, or beside one another in a larger burn-in unit enclosure. Hot air can be blown in from the bottom or sides of the unit. Local heaters, thermocouples, or other temperature-sensors can also be used to better regulate and control heating. The unit could be turned, rotated, flipped, or otherwise re-oriented. Cooling, humidity, or other environmental testing could also be performed.

Backplane 28 can route power and ground to all pattern-generator cards 44 and all module motherboards 30. Monitoring and control signals can also be routed through backplane 28, such as reset signals to pattern generators 42 or result or status data from pattern generator 42 to a central controller or network interface to a host.

Figure 6:
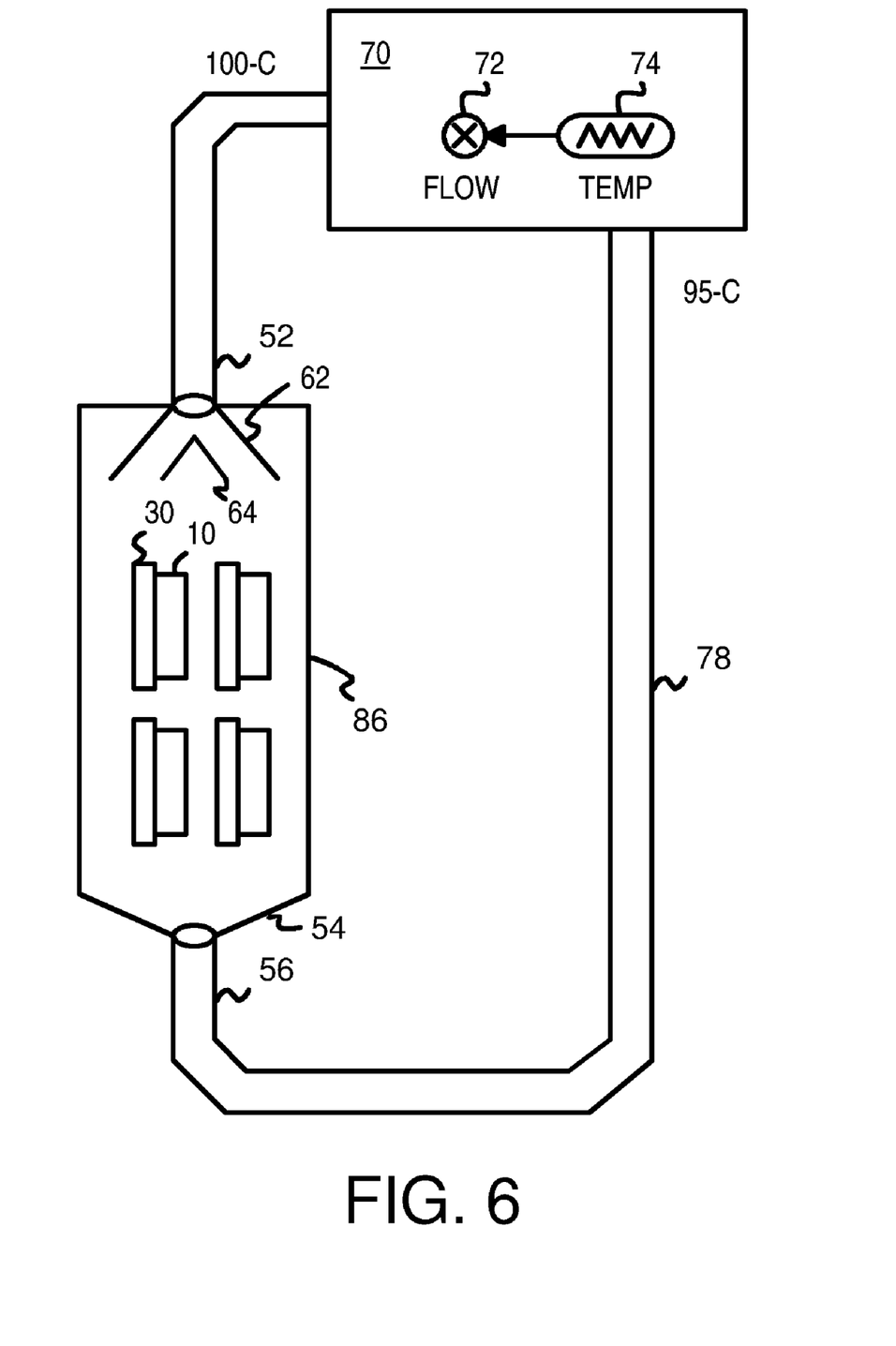
FIG. 6 is a diagram showing hot air circulation through a return pipe around the heat chamber.

Hot-Air Flow Through Return Pipe—FIG. 6

FIG. 6 is a diagram showing hot air circulation through a return pipe around the heat chamber. Heated air is blown through inlet pipe 52 into the heat chamber and is distributed by deflectors 62 and manifold 64. The hot air flows over the edges of module motherboards 30 to heat memory modules 10, which are tested by the pattern-generator cards (not shown) hidden behind the backplane, that forms the back of heat chamber 86.

The air flow is collected at the bottom of the heat chamber by heat-chamber bottom cover 54 and diverted through return pipe 56. Return ducting 78 returns the air from return pipe 56 to heating unit 70. A variety of turns, fittings, pipes and ducts may be used in return ducting 78 to return the air. Heating unit 70 can be mounted on the top of a cabinet that includes the heat chamber, or can be mounted separately.

Return air from return pipe 56 and return ducting 78 is heated by heater 74 in heating unit 70, and is blown out by blower 72 into inlet pipe 52. Insulation is needed for return ducting 78 to reduce heat loss in the return air path. Since return ducting 78 is longer than heat chamber 86, a significant amount of insulation is needed or heat loss can be significant. Also, air is compressed going into return pipe 56 from heat chamber 86, and frictional losses occur in return ducting 78. These inefficiencies in the air flow may require that more power and pressure be produced by blower 72 in heating unit 70. This increases energy usage and operating costs.

Figure 7:
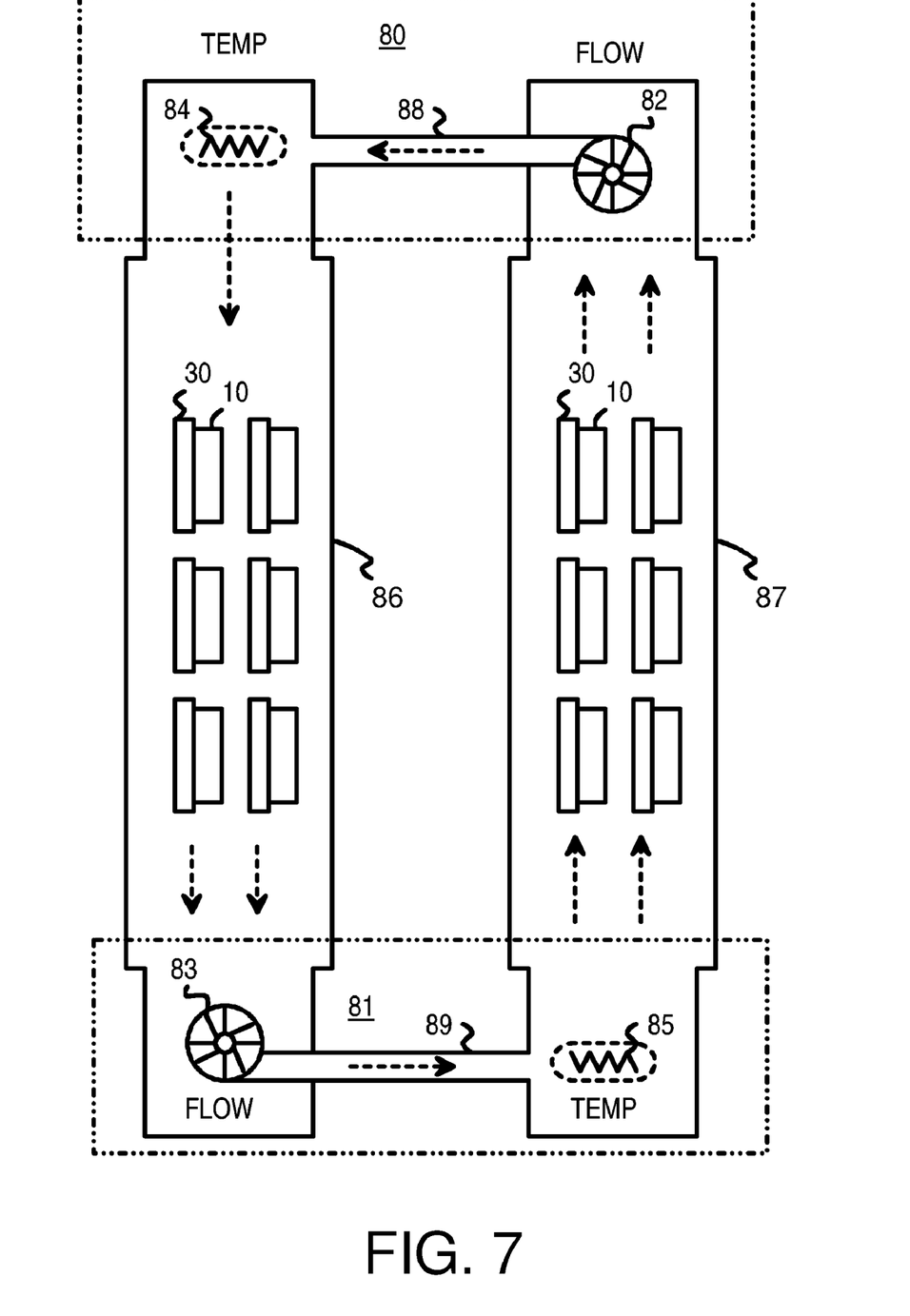
FIG. 7 shows dual heat chambers with forced hot-air flow forming a continuous loop.

Improvement—Dual Chamber Air Flow—FIG. 7

The inventor has realized that return ducting 78 is inefficient and can be replaced by a second heat chamber. Hot air flows downward though one heat chamber, then upward through a second heat chamber. Heating units can be placed at both the top and bottom so that freshly heated air is blown into each heat chamber. This produces better symmetry and heating uniformity between heat chambers.

FIG. 7 shows dual heat chambers with forced hot-air flow forming a continuous loop. While memory modules 10 under test on module motherboard 30 are heated, pattern-generator cards 44 are kept cooler than module motherboards 30 because a back area is separated from heat chamber 86 by insulated backplane 28. Cool air can thus be blown across pattern-generator cards 44. Pattern generators 42 on pattern-generator cards 44 can be kept cooler than memory modules 10, allowing for longer life and better current drive of pattern generator 42.

Heated air is blown downward through first heat chamber 86 by upper heating unit 80, while re-heated air is blown upward through second heat chamber 87 by lower heating unit 81. Exhaust air from the bottom of first heat chamber 86 is gathered by blower 83 in lower heating unit 81 and blown across heater 85 and then deflected upward into second heat chamber 87. The heated air heats memory modules in second heat chamber 87 as it passes upward. Exhaust air from the top of second heat chamber 87 is then gathered by blower 82 in upper heating unit 80 and blown across heater 84 and then deflected downward into first heat chamber 86. The heated air heats memory modules in first heat chamber 86 as it passes downward.

Upper heating unit 80 and lower heating unit 81 can each span the width of two heat chambers. For example, blowers may be located over one heat chamber, while the heating elements are located over the second heat chamber. This allows for a lower height of upper heating unit 80 and lower heating unit 81, since a larger width is available.

Blower 82 may be an impeller-type air fan that blows air into pipe 88, which directs the air flow over heating elements of heater 84. Likewise, blower 83 may blow air into pipe 89, which directs the air flow over heating elements of heater 85. Rather than be a pipe with a circular cross-section, pipes 88, 89 may be ducting or chambers formed by sheet metal or other materials in various shapes such as in rectangular chambers.

Figure 8:
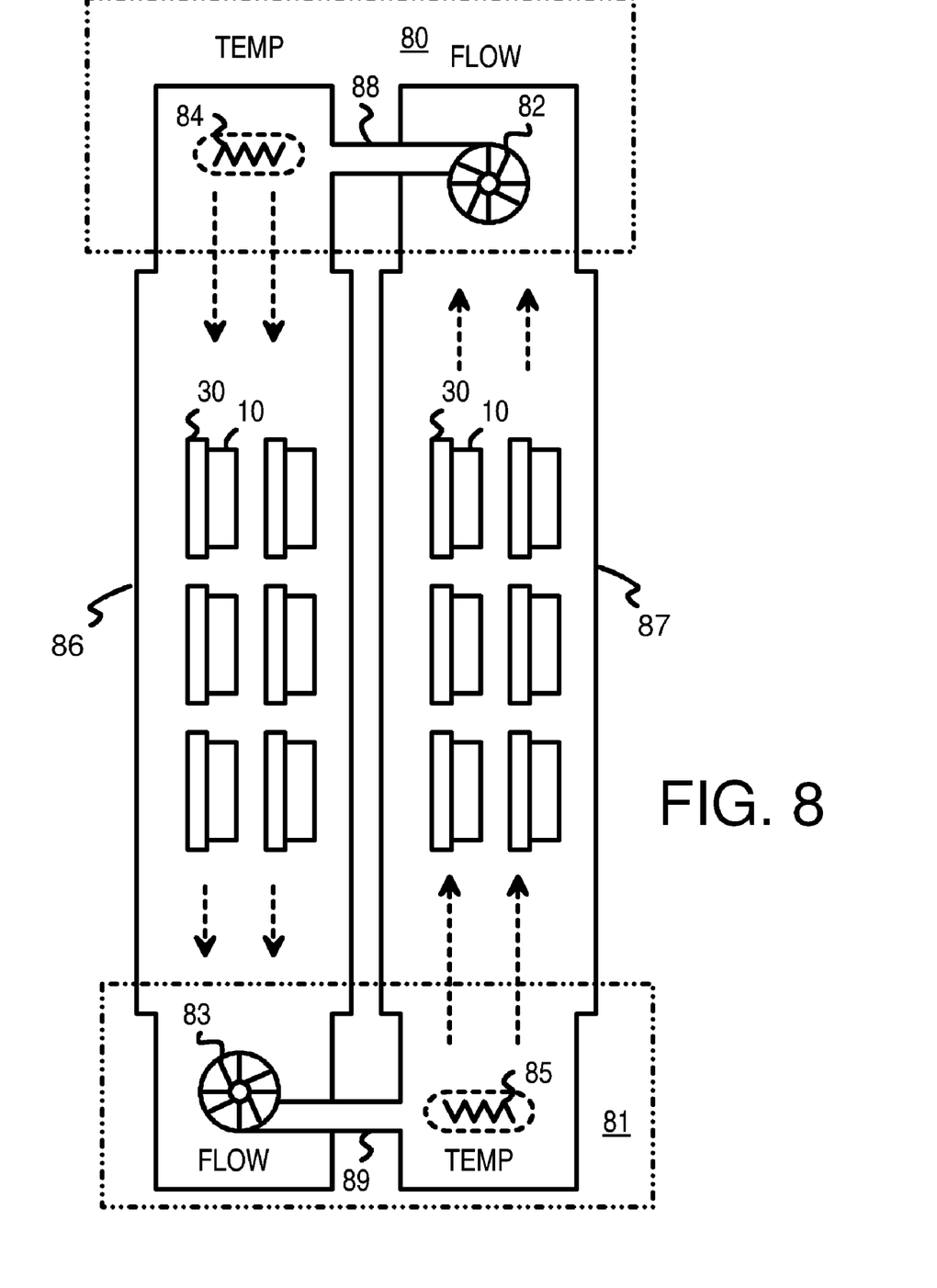
FIG. 8 shows that the two heat chambers may be placed in close proximity to each other to reduce ducting between chambers.

FIG. 8 shows that the two heat chambers may be placed in close proximity to each other to reduce ducting between chambers. Pipes 88, 89 are shorter than in FIG. 8 since first heat chamber 86 and second heat chamber 87 are placed close to each other, such as side-by-side in cabinets. The shorter lengths of pipes 88, 89 reduce frictional losses and air flow inefficiencies.

Since the return air path for first heat chamber 86 is second heat chamber 87, losses due to a return pipe are eliminated. A very efficient air flow path is produced. Since upper heating unit 80 and lower heating unit 81 produce re-heated air for each heat chamber, symmetric, even heating is produced for each heat chamber.

A high density of heat chambers can be achieved by placing heat chambers side by side in vertical cabinets that are locked together by upper and lower heating units that span pairs of chambers. For example, 12 chambers could be placed side-by-side, having 6 air loops. Air could also pass through more than 2 chambers in a serpentine fashion, or chambers could be arranged in a loop or ring.

The recirculated air can be heated by a small amount, such as from 95 to 100 degrees C. Faster air flow may result in even smaller temperature differentials, such as heating from 98 to 100 degrees C. The air flow or its pressure can be regulated by heating units 80, 81 while the temperature can be regulated using temperature sensors in the air stream or at various places in the heat chamber. A variety of closedloop flow and temperature control algorithms may be used by heating units 80, 81 to regulate temperature.

The orientation of memory modules 10 and module motherboards 30 in first heat chamber 86 and second heat chamber 87 do not have to be inverted relative to each other. Instead, first heat chamber 86 and second heat chamber 87 can have the same orientation. Thus all heat chambers appear to be identical to technicians and operators, as memory modules and module motherboards are inserted in the same direction and manner. While the air flow is reversed in alternate heat chambers, the module and board orientation may be identical.

The top and bottom of heat chambers 86, 87 may be open, covered by a screen or mesh, or could be a flat plate with an opening in it. A conical or pyramid shape may be used to better distribute the hot air delivered from heating units 80, 81 over module motherboards 30, and for collecting air exiting the heat chamber. Layers of foam insulation may be attached to backplane 28 and to surfaces of heat chambers 86, 87. Module motherboards 30 can be mounted on racks inside heat chambers 86, 87 enclosed by sides and backplane 28. Insulating glass windows or doors may also be added to heat chambers 86, 87.

Figure 9A:
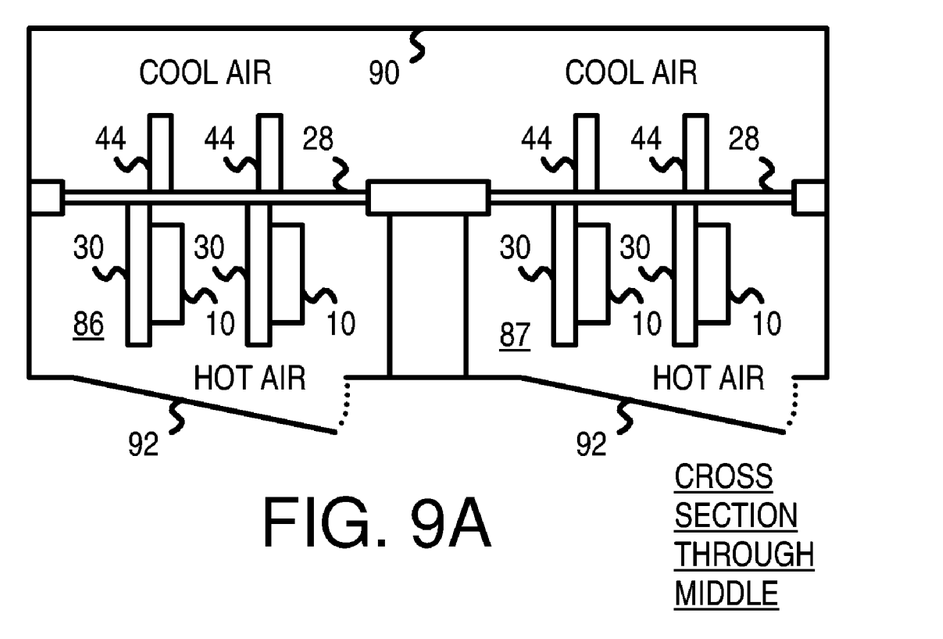
FIGS. 9A–D are various sectional views of a dual heat chamber with integrated heaters and blowers for a continuous heating loop through two heat chambers.

FIGS. 9A–D are various sectional views of a dual heat chamber with integrated heaters and blowers for a continuous heating loop through two heat chambers. FIG. 9A shows a cross-sectional view through the middle of two heat chambers. Hot air generated by upper heating unit 80 (not shown) is blowing downward through first heat chamber 86 while hot air generated by lower heating unit 81 is blowing upward through second heat chamber 87. Inside each of heat chambers 86, 87 module motherboards 30 hold memory modules 10 that are being heated by the hot air blowing through heat chambers 86, 87.

Memory modules 10 are being electrically exercised by test patterns that are generated by pattern-generator cards 44. Backplane 28 electrically connects pattern-generator cards 44 to memory modules 10. Backplane 28 may have insulating foam covering it to thermally isolate first heat chamber 86 and second heat chamber 87 from a cooler back chamber that contains pattern-generator cards 44. Cooling fans may blow cooler air over pattern-generator cards 44 within this back chamber while memory modules 10 inside first heat chamber 86 and second heat chamber 87 are heated.

Doors 92 may be provided in chassis 90 to allow access to memory modules 10. A technician or operator may open doors 92 and remove module motherboards 30 and memory modules 10 upon completion of a test, and insert new memory modules 10 into module motherboard 30 and into first heat chamber 86 and second heat chamber 87.

Figure 9B:
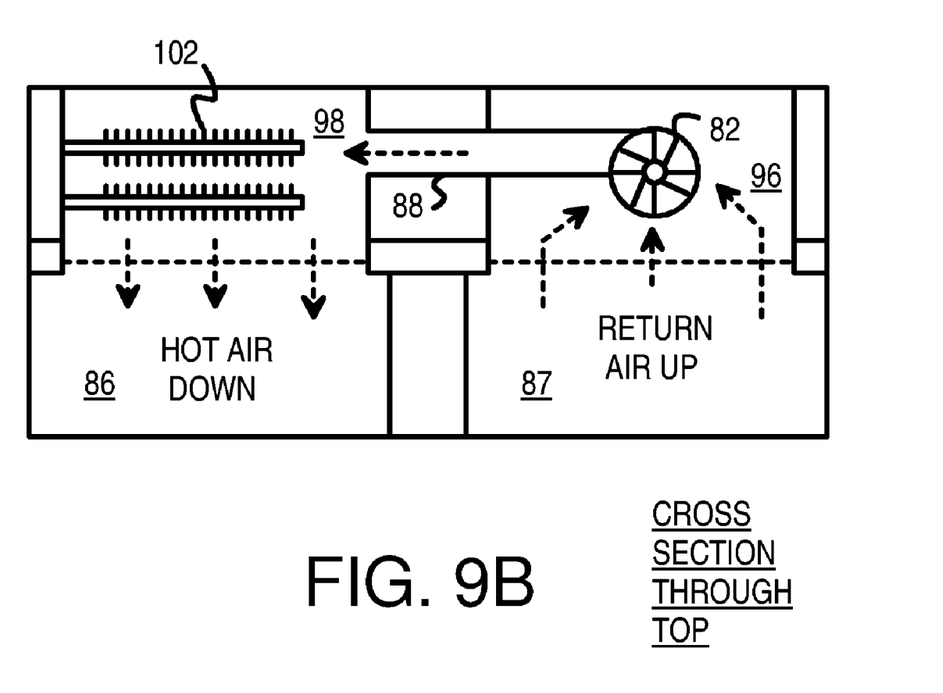

FIG. 9B shows a cross-sectional view through upper heating unit 80 above first heat chamber 86 and second heat chamber 87. Air that has heated memory modules 10 inside second heat chamber 87 flows upward and is deflected inward by the top (roof) of second heat chamber 87. This return air is collected in collecting chamber 96, which may be above pattern-generator cards 44 in the back cooling chamber of FIG. 9A. The return air collected in collecting chamber 96 is fed into the intake of blower 82. Blower 82 then pushes the return air into pipe 88. Blower 82 may have an electric motor that spins fan blades or impellers that force the air into pipe 88 using centrifugal force.

The air blown into pipe 88 by blower 82 is blown over resistive heating elements 102. The air flowing over resistive heating elements 102 is warmed. Resistive heating elements 102 may be located in heating chamber 98 that is formed over pattern-generator cards 44 (FIG. 9A). A metal divider or floor may separate 98 from the back chamber of pattern-generator cards 44. Another metal divider may separate collecting chamber 96 from the back chamber. Other metal dividers form the sides of collecting chamber 96 and heating chamber 98. These dividers may have various shapes, such as curved corners to improve air flow, or deflectors to direct the air flow.

The re-heated air that has flowed over resistive heating elements 102 exits heating chamber 98 and enters the top of first heat chamber 86. This heated air is diverted downward by the top and sides of first heat chamber 86. The heated air may now flow over memory modules 10 inside first heat chamber 86, warming memory modules 10.

Figure 9C:
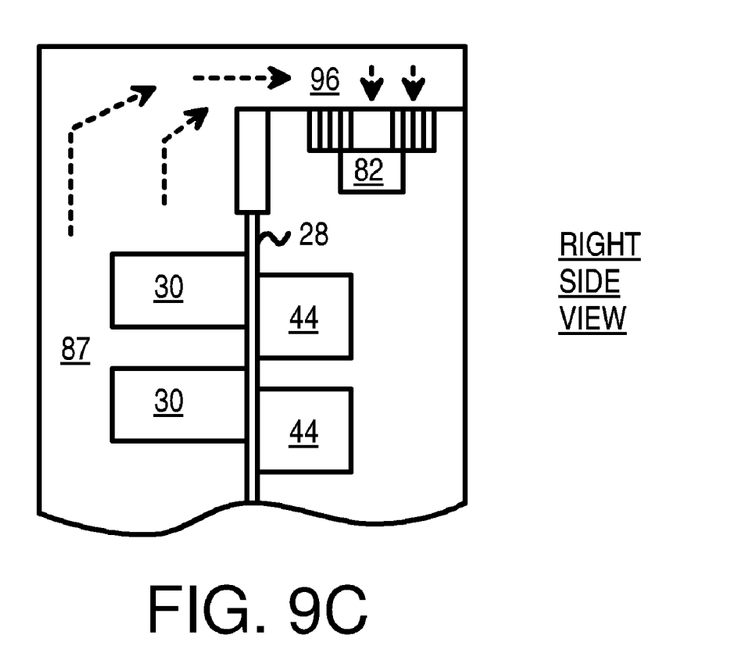

FIG. 9C is a view from the right side of the dual heat chambers. Heated air flows upward through second heat chamber 87, warming memory modules 10 (not shown) inserted into module motherboard 30. At the top of second heat chamber 87, the return air is deflected back toward collecting chamber 96, which is formed over the back chamber holding pattern-generator cards 44. Backplane 28 electrically connects module motherboard 30 to pattern-generator cards 44 but thermally isolates second heat chamber 87 from cooling air in the back chamber.

The return air flowing into collecting chamber 96 is sucked into intakes of blower 82, which may be mounted below collecting chamber 96. Blower 82 has an electric motor that spins fan blades, expelling the air out into pipe 88 (not shown) that blows the air in a direction perpendicular to the plane of FIG. 9C.

Figure 9D:
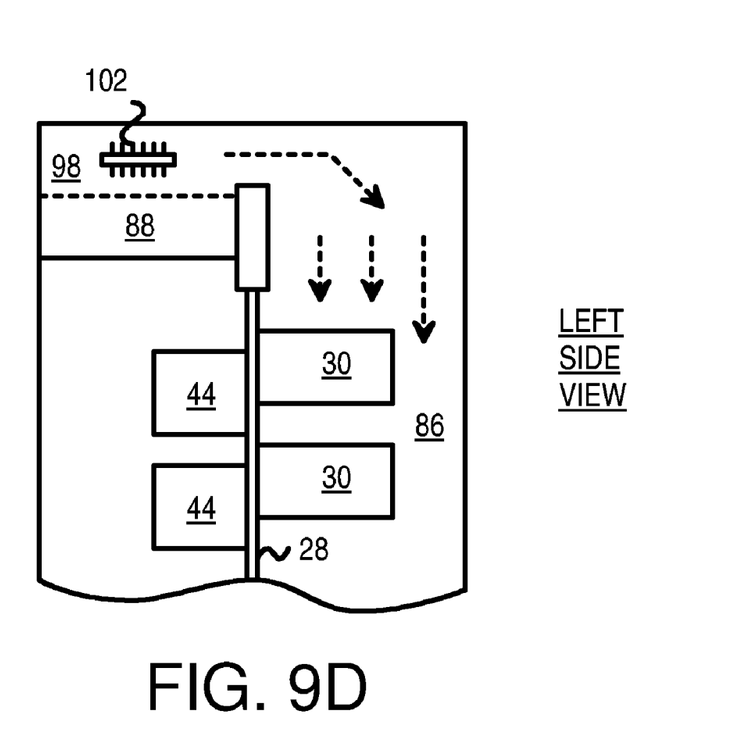

In FIG. 9D, air from blower 82 (FIG. 9C) is blown outward from pipe 88 into heating chamber 98. This air is blown over resistive heating elements 102 and is therefore heated inside heating chamber 98. The heated air exits heating chamber 98 and flows over the top of a frame above backplane 28 and into first heat chamber 86. The heated air is deflected downward from the top of first heat chamber 86 and passes over memory modules 10 (not shown) inserted into module motherboards 30.

ALTERNATE EMBODIMENTS

Several other embodiments are contemplated by the inventors. A wide variety of geometries, angles, arrangements, and combinations of chambers, dividers, boards, pipes, and ducting may be used. The exact physical arrangements of heating units and chambers shown herein is only one of many possible arrangements. Materials other than metal may be used for frames, chambers, chassis, etc.

Memory modules designated as high reliability can be tested within the burn-in system for various periods of time, or only a sampling of memory modules from production runs can be tested within the burn-in chamber to monitor reliability and detect manufacturing problems. Prototype and engineering testing can also be performed. Other testing of the memory modules can also be performed before or after testing within the burn-in system.

Some embodiments may have ejectors on cards, or may have other handling or insertion/removal devices. Many variations in shapes and cross sections can be substituted for manifolds, holes, deflectors, heat-chamber bottom and top covers, etc. Multiple pipes, ducts, and manifolds could be used. Air flow may be streamlined or laminar at low flow rates, but turbulent at higher flow rates. Eddies, flow diversions, dead spots, and other flow inefficiencies may still be present to some extent. Better heat transfer to the memory modules can be ensured by increasing the flow rates, producing a smaller boundary layer near surfaces of the memory modules. Desirable flow rates and heating loads can often be determined empirically.

Rather than blow in heated air from the top, the heated air may enter from other locations such as the sides or bottom. However, the heat generated by the modules themselves may tend to gather at the upper half of the chamber. A strong airflow from the top may help to distribute this heat. It is thus thought that a more even heat distribution can be achieved by blowing the hot air downward rather than upward. The blower in lower heating unit 81 may thus be adjusted to blow more strongly than the blower in upper heating unit 80.

Pattern generator cards 44 could use a standard DRAM controller activated by a programmable device such as a processor or state machine, or pattern generators could be a state machine or controller. Buffers could be located on pattern-generator card 44 in the cooler environment, or could be located on module motherboard 30 in the hot environment, but closer to the memory modules being driven. Some buffers, registers, or clock drivers could be on pattern-generator card 44 while others are on module motherboard 30 or even on backplane 28. Patterns could be generated to write all locations on large DRAM chips, such as by writing to a million or more addresses.

Rather than have each module motherboard 30 driven by one pattern-generator card 44, a pattern-generator card 44 could drive several module motherboards 30.

The number of test sockets on the motherboards could vary, and additional components could be added to the module motherboards. More than one edge socket could be used for each connection. Different mounting mechanisms and electrical connections could be substituted. The motherboard and pattern-generator card may be substantially perpendicular to the backplane by being at an angle such as from 60 to 120 degrees rather than exactly 90 degrees. A thicker fiberglass board or other additional insulation that better insulates the pattern-generator cards from the elevated temperatures near module motherboards can also be used.

Many kinds of memory modules can be tested. Modules using standard DRAM or newer EDO and synchronous DRAM can be tested. The system is ideally suited for testing the highest-speed memory modules, since signal trace length and capacitive loading is minimized. Other memories such as RAMBUS modules, DDR modules, and PC133 synchronous modules can be tested.

Various sizes of memory in the memory module, and form factors for memory modules can be used with the invention, limited by the module motherboard 30 and memory-module sockets. Different kinds of module motherboards and pattern-generator cards can be substituted. A Yamaichi type connector could be used as the memory-module sockets, but a production-quality connector/socket with low insertion force may be substituted. A production quality connector/socket can take more insertions (greater than 100,000 times) than conventional sockets on motherboards (rated for 100 insertions). A production socket also has an ejector normally located at the two edges of the socket. This alleviates the ejection of modules.

A network controller card on an ISA or PCI bus that communicates with a main system interface or host can be used. A controller card or a standard parallel or serial-port may interface to the main system interface or host. FireWire, USB, or other emerging standards can be used for the interfaces.

Cascading or expansion is possible. Capacitive loading by the memory modules can limit the number of modules that can be placed on a bus for a given operating frequency. In order to use one pattern generator card, another buffer can be placed at the end of the bus for regenerating the test signal. The regenerated test signal may be used to drive a subsequent bank of modules and terminations. This may be possible when all the test signals are propagating in the same direction, for example, writes to the modules only.

During writes, all memory modules can be selected and written in parallel at the same time. There can be separate module select lines (static, not dynamic) for each module. Writing can happen concurrently on all modules. During read, only one module is selected, and a bus conflict is avoided. The read data can be read back or ignored. The address, data, and most control lines are bussed in parallel; the module select lines are not. The module select lines are DRAM chip selects which are made available as pins on the memory module for the module select function.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A dual-chamber-loop environmental tester for memory modules comprising:

a first environmental chamber and a second environmental chamber, each environmental chamber comprising:

a backplane forming one side of an environmental chamber;

motherboard sockets mounted on a first side of the backplane;

removable module motherboards for insertion into the motherboard sockets;

a plurality of memory-module sockets mounted on each of the removable module motherboards, the plurality of memory module sockets for receiving memory modules for environmental testing in the environmental chamber;

card sockets mounted on a second side of the backplane;

removable pattern-generator cards for insertion into the card sockets;

a pattern generator on each of the removable pattern-generator cards for generating address, data, and control signals to write data to a plurality of memory locations on memory chips on the memory modules inserted into the memory-module sockets on the removable module motherboards;

a first heating unit that receives second return air from the second environmental chamber and generates first heated air that is forced into the first environmental chamber; and a second heating unit that receives first return air from the first environmental chamber and generates second heated air that is forced into the second environmental chamber;

wherein the first heated air from the first heating unit is forced into the first environmental chamber and flows past the memory modules in the first environmental chamber to heat the memory modules, wherein the first heated air having passed the memory modules in the first environmental chamber becomes the first return air expelled from the first environmental chamber into the second heating unit;

wherein the second heated air from the second heating unit is forced into the second environmental chamber and flows past the memory modules in the second environmental chamber to heat the memory modules, wherein the second heated air having passed the memory modules in the second environmental chamber becomes the second return air expelled from the second environmental chamber into the first heating unit;

wherein air is recycled through the first environmental chamber and the second environmental chamber by the first heating unit and the second heating unit, whereby memory modules are tested within the first and second environmental chambers by pattern generators on removable pattern-generator cards outside the first and second environmental chambers that are separated by the backplane.

2. The dual-chamber-loop environmental tester for memory modules of claim 1 wherein the first heated air flows past the memory modules in the first environmental chamber in substantially a first direction;

wherein the second heated air flows past the memory modules in the second environmental chamber in substantially a second direction;

wherein the first direction is opposite the second direction.

3. The dual-chamber-loop environmental tester for memory modules of claim 2 wherein the first direction is downward and the second direction is upward.

4. The dual-chamber-loop environmental tester for memory modules of claim 3 wherein the first heating unit is located above the first environmental chamber and above the second environmental chamber;

wherein the second heating unit is located below the first environmental chamber and below the second environmental chamber.

5. The dual-chamber-loop environmental tester for memory modules of claim 1 wherein the first heating unit further comprises:

a first air blower, situated outside the first environmental chamber, the first air blower generating first forced air; and a first heater for heating the first forced air to generate the first heated air, the first air blower forcing the first forced air over the first heater and into the first environmental chamber as the first heated air.

6. The dual-chamber-loop environmental tester for memory modules of claim 5 wherein the first heating unit further comprises:

a first blower duct that receives the first forced air from the first air blower and directs the first forced air over the first heater;

a first collecting chamber connected to the second environmental chamber to collect the second return air from the second environmental chamber and provide the second return air to a first intake of the first air blower; and a first heating chamber containing the first heater and coupled to direct the first heated air into the first environmental chamber.

7. The dual-chamber-loop environmental tester for memory modules of claim 6 wherein the first heater comprises first resistive heating elements.

8. The dual-chamber-loop environmental tester for memory modules of claim 6 wherein the first air blower is located above the second environmental chamber and the first heater is located above the first environmental chamber.

9. The dual-chamber-loop environmental tester for memory modules of claim 8 wherein the second heating unit further comprises:

a second air blower, situated outside the second environmental chamber, the second air blower generating second forced air; and a second heater for heating the second forced air to generate the second heated air, the second air blower forcing the second forced air over the second heater and into the second environmental chamber as the second heated air.

10. The dual-chamber-loop environmental tester for memory modules of claim 9 wherein the second air blower is located below the first environmental chamber and the second heater is located below the second environmental chamber.

11. The dual-chamber-loop environmental tester for memory modules of claim 10 wherein the second heating unit further comprises:

a second blower duct that receives the second forced air from the second air blower and directs the second forced air over the second heater;

a second collecting chamber connected to the first environmental chamber to collect the first return air from the first environmental chamber and provide the first return air to a second intake of the second air blower; and a second heating chamber containing the second heater and coupled to direct the second heated air into the second environmental chamber.

12. The dual-chamber-loop environmental tester for memory modules of claim 6 wherein the first blower duct has forced air flow that is substantially perpendicular to air flow past the memory modules within the first environmental chamber.

13. A looping-air-flow memory-module burn-in system comprising:

a first chamber for heating first memory modules;

a first backplane forming a side of the first chamber, for making electrical connections, the first backplane having an inner side facing into the first chamber and an outer side facing away from the first chamber;

first external connector sockets, on the outer side of the first backplane;

first internal sockets, on the inner side of the first backplane;

wherein first external connector sockets are electrically connected to a corresponding first inner socket;

first pattern-generator cards inserted into the first external connector sockets, for generating test patterns to write locations in dynamic-random-access memory (DRAM) chips on the first memory modules heated in the first chamber;

first module motherboards inserted into the first internal sockets, containing memory module sockets for receiving the first memory modules, each first module motherboard being within the first chamber and having wiring traces for connecting signals carrying the test patterns from the first pattern-generator cards passed through the first backplane to the first internal socket to the first memory modules inserted into the memory module sockets on the first module motherboard;

wherein the first pattern-generator cards are external to the first chamber but the first module motherboards are inside the first chamber;

a second chamber for heating second memory modules;

a second backplane forming a side of the second chamber, for making electrical connections, the second backplane having an inner side facing into the second chamber and an outer side facing away from the second chamber;

second external connector sockets, on the outer side of the second backplane;

second internal sockets, on the inner side of the second backplane;

wherein second external connector sockets are electrically connected to a corresponding second inner socket;

second pattern-generator cards inserted into the second external connector sockets, for generating test patterns to write locations in DRAM chips on the second memory modules heated in the second chamber;

second module motherboards inserted into the second internal sockets, containing memory module sockets for receiving the second memory modules, each second module motherboard being within the second chamber and having wiring traces for connecting signals carrying the test patterns from the second pattern-generator cards passed through the second backplane to the second internal socket to the second memory modules inserted into the memory module sockets on the second module motherboard;

wherein the second pattern-generator cards are external to the second chamber but the second module motherboards are inside the second chamber; and a first air recycling unit coupled to receive second return air that has passed through the second chamber, for heating the second return air to generate first recycled air that enters the first chamber;

wherein first return air from the first chamber is recycled back to the second chamber, whereby first memory modules are heated in the first chamber and tested by the first module motherboards using test patterns generated externally by the first pattern-generator cards, and second memory modules are heated in the second chamber and tested by the second module motherboards using test patterns generated externally by the second pattern-generator cards.

14. The looping-air-flow memory-module burn-in system of claim 13 further comprising:

a second air recycling unit coupled to receive first return air that has passed through the first chamber, for heating the first return air to generate second recycled air that enters the second chamber.

15. The looping-air-flow memory-module burn-in system of claim 14 wherein the first recycled air passes through the first chamber in a first direction;

wherein the second recycled air passes through the second chamber in a second direction;

wherein the first direction and the second direction are substantially parallel and substantially opposite.

16. The looping-air-flow memory-module burn-in system of claim 15 wherein the first direction is downward and the second direction is upward.

17. The looping-air-flow memory-module burn-in system of claim 16 wherein the first air recycling unit is situated near a top of the first chamber and near a top of the second chamber;

wherein the second air recycling unit is situated near a bottom of the second chamber and near a bottom of the first chamber.

18. The looping-air-flow memory-module burn-in system of claim 14 wherein the first air recycling unit comprises a first air blower and a first heater; and wherein the second air recycling unit comprises a second air blower and a second heater.

19. A circulating dual-loop burn-in chamber for testing memory modules comprising:

pattern-generator means for generating test patterns for testing dynamic-random-access memory (DRAM) chips on memory modules;

external socket means for electrically connecting and mechanically supporting an external card external to a first heated portion of the circulating dual-loop burn-in chamber and external to a second heated portion of the circulating dual-loop burn-in chamber;

pattern-generator card means for removably connecting the pattern-generator means to the external socket means;

first socket means for electrically connecting and mechanically supporting an internal card inside the first heated portion of the circulating dual-loop burn-in chamber;

second socket means for electrically connecting and mechanically supporting an internal card inside the second heated portion of the circulating dual-loop burn-in chamber;

a plurality of module motherboard means for removably connecting to the first socket means and for removably connecting to the second socket means;

memory module socket means, on the module motherboard means, for receiving memory modules for testing on the circulating dual-loop burn-in chamber in the first heated portion or in the second heated portion;

first insulated backplane means for electrically connecting the external socket means to the first socket means;

second insulated backplane means for electrically connecting the external socket means to the second socket means;

first heat chamber means for enclosing a first plurality of the module motherboard means, forming the first heated portion of the circulating dual-loop burn-in chamber with the first insulated backplane means as a wall;

second heat chamber means for enclosing a second plurality of the module motherboard means, forming the second heated portion of the circulating dual-loop burn-in chamber with the second insulated backplane means as a wall;

wherein the first insulated backplane means is further for thermally insulating the first plurality of the module motherboard means inside the first heated portion of the circulating dual-loop burn-in chamber from the pattern-generator card means external to the first heated portion of the circulating dual-loop burn-in chamber;

wherein the second insulated backplane means is further for thermally insulating the second plurality of the module motherboard means inside the second heated portion of the circulating dual-loop burn-in chamber from the pattern-generator card means external to the second heated portion of the circulating dual-loop burn-in chamber;

first heating means, coupled between the second heated portion and the first heated portion of the circulating dual-loop burn-in chamber, receiving second return air from the second heated portion, for generating first heated air that is forced into the first heated portion; and second heating means, coupled between the first heated portion and the second heated portion of the circulating dual-loop burn-in chamber, receiving first return air from the first heated portion, for generating second heated air that is forced into the second heated portion, whereby air is recycled through the first heated portion and the second heated portion of the circulating dual-loop burn-in chamber to heat the memory modules for testing.

20. The circulating dual-loop burn-in chamber for testing memory modules of claim 19 wherein the first heating means further comprises:

first air blower means, situated outside the first heated portion, for generating first forced air;

first heater means for heating the first forced air to generate the first heated air, the first air blower means forcing the first forced air over the first heater means and into the first portion as the first heated air;

wherein the second heating means further comprises:

second air blower means, situated outside the second heated portion, for generating second forced air;

second heater means for heating the second forced air to generate the second heated air, the second air blower means forcing the second forced air over the second heater means and into the second portion as the second heated air.

* * * * *